(12) United States Patent
Braganca, Jr. et al.

(10) Patent No.: US 11,688,718 B2
(45) Date of Patent: Jun. 27, 2023

(54) SEMICONDUCTOR DEVICE AND METHOD OF CONTROLLING WARPAGE DURING LAB

(71) Applicant: STATS ChipPAC Pte. Ltd., Singapore (SG)

(72) Inventors: Wagno Alves Braganca, Jr., Incheon (KR); KyungOe Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 3 days.

(21) Appl. No.: 17/447,001

(22) Filed: Sep. 7, 2021

(65) Prior Publication Data

US 2023/0077132 A1 Mar. 9, 2023

(51) Int. Cl.
*H01L 21/683* (2006.01)
*H01L 23/00* (2006.01)
*H01L 21/78* (2006.01)

(52) U.S. Cl.
CPC .......... *H01L 24/97* (2013.01); *H01L 21/6835* (2013.01); *H01L 21/78* (2013.01); *H01L 24/16* (2013.01); *H01L 24/81* (2013.01); *H01L 2221/68327* (2013.01); *H01L 2221/68372* (2013.01); *H01L 2224/16235* (2013.01); *H01L 2224/81005* (2013.01); *H01L 2224/81224* (2013.01); *H01L 2224/95001* (2013.01); *H01L 2924/3511* (2013.01)

(58) Field of Classification Search
CPC ..... H01L 24/97; H01L 21/6835; H01L 21/78; H01L 24/16; H01L 24/81; H01L 2221/68327; H01L 2221/68372; H01L 2224/16235; H01L 2224/81005; H01L 2224/81224; H01L 2224/95001; H01L 2924/3511
USPC ........................................................ 438/666
See application file for complete search history.

(56) References Cited

U.S. PATENT DOCUMENTS

| | | | |
|---|---|---|---|
| 6,426,138 B1 * | 7/2002 | Narushima | H01L 24/29 428/354 |
| 7,675,182 B2 * | 3/2010 | Sun | H01L 23/3157 257/788 |
| 8,368,232 B2 * | 2/2013 | Bchir | H01L 24/81 257/782 |
| 8,967,452 B2 | 3/2015 | Cheung et al. | |
| 9,704,823 B2 * | 7/2017 | Kamphuis | H01L 21/304 |

(Continued)

*Primary Examiner* — Vu A Vu
(74) *Attorney, Agent, or Firm* — Robert D. Atkins; Patent Law Group: Atkins and Associates, P.C.

(57) ABSTRACT

A semiconductor device has a semiconductor die and a support tape disposed over a back surface of the semiconductor die opposite an active surface of the semiconductor die. A portion of the back surface of the semiconductor wafer is removed to reduce its thickness. The semiconductor die is part of a semiconductor wafer, and the wafer is singulated to provide the semiconductor die with the support tape disposed on the back surface of the semiconductor die. The support tape can be a polyimide tape. A dicing tape is disposed over the support tape. The semiconductor die is disposed over a substrate. A laser emission is projected onto the semiconductor die to bond the semiconductor die to the substrate. The support tape provides stress relief to avoid warpage of the semiconductor die during the laser emission. The support tape is removed from the back surface of the semiconductor die.

20 Claims, 9 Drawing Sheets

(56) References Cited

U.S. PATENT DOCUMENTS

| 10,607,877 | B2* | 3/2020 | Lee | ................... H01L 21/67115 |
| 2018/0366435 | A1 | 12/2018 | Ahn | |
| 2020/0075535 | A1 | 3/2020 | Choi et al. | |
| 2020/0243478 | A1* | 7/2020 | Hsieh | ...................... H01L 24/95 |

\* cited by examiner

SEMICONDUCTOR DEVICE AND METHOD OF CONTROLLING WARPAGE DURING LAB

FIELD OF THE INVENTION

The present invention relates in general to semiconductor devices and, more particularly, to a semiconductor device and method of controlling warpage during LAB.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor device is commonly connected to a substrate for structural support and electrical interconnect. One known technique of bonding a semiconductor device to the substrate involves laser assisted bonding (LAB), in which laser emission is projected to the bonding surface to melt fusible material. When the laser emission is removed, the fusible material resolidifies and bonds the semiconductor device to the substrate. The laser emission is known to induce stress and possible warpage in the semiconductor device due to the presence of heat over a large area, particularly for a large and/or thin semiconductor wafer or die. Compression LAB (cLAB) has been used to handle devices with a high susceptibility to warpage. Compressive pressure is applied to the semiconductor wafer or die during laser emission. However, cLAB introduces complex process control parameters, such as planarity of the compression tool, planarity of work block, contact speed, force control, and position control. Also, there is a high risk of bump-pad misalignment during cLAB. Temperature monitoring is impractical with an infrared (IR) camera.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
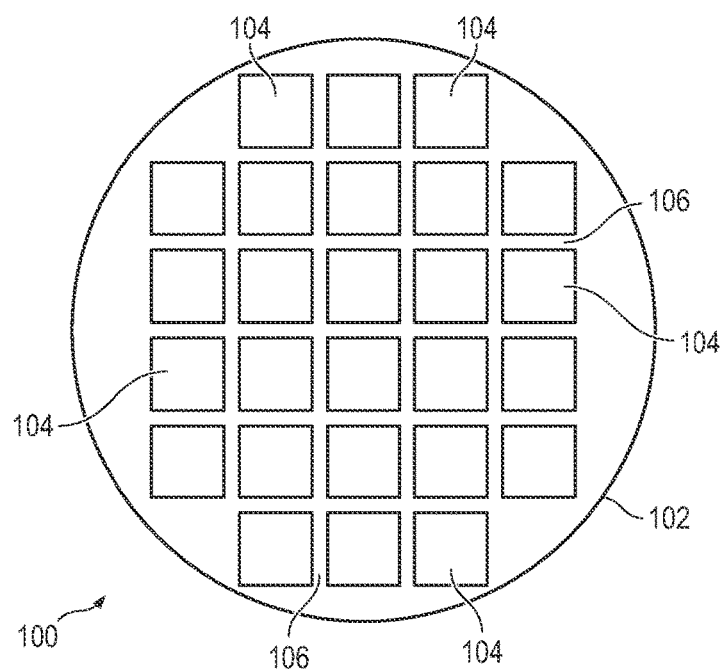
FIGS. 1a-1b illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
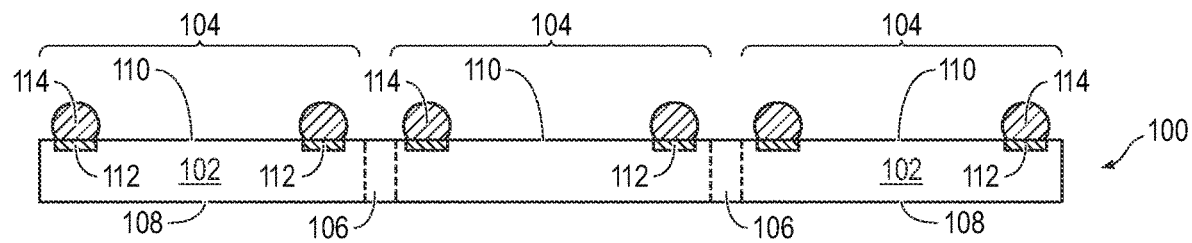

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, and other circuits for RF signal processing. Surface 108 can undergo backgrinding to planarize semiconductor die 104.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 2A:
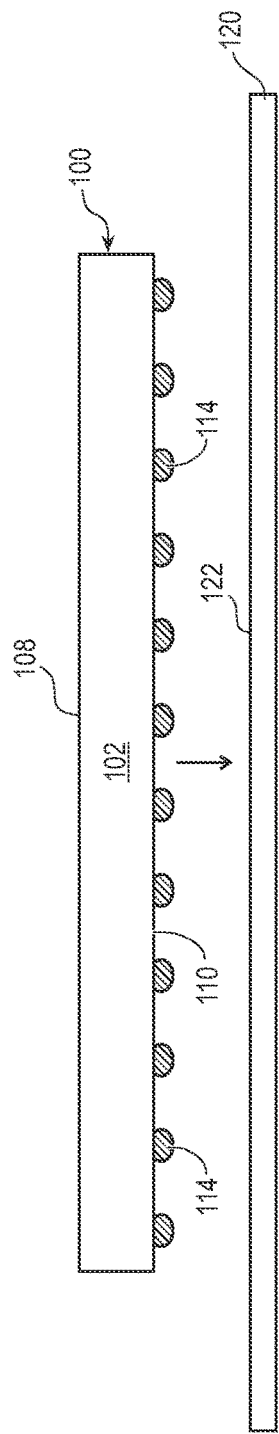
FIGS. 2a-2r illustrate a process of bonding an electrical component covered with PI tape to a substrate using LAB.
Figure 2B:
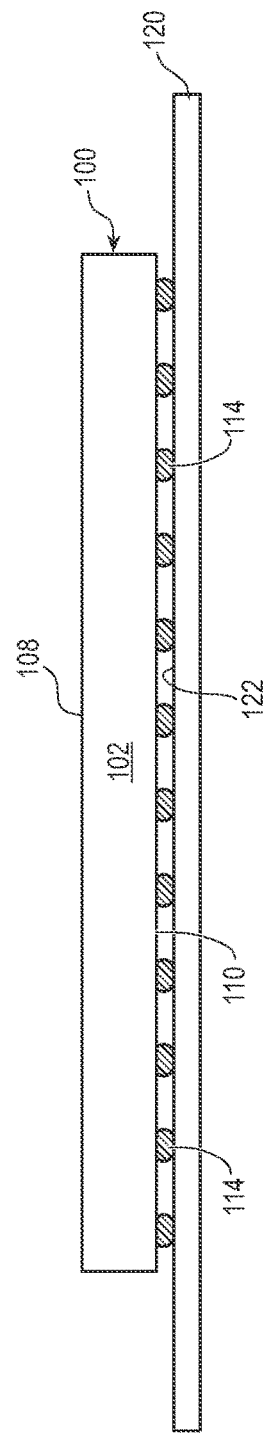
Figure 2C:
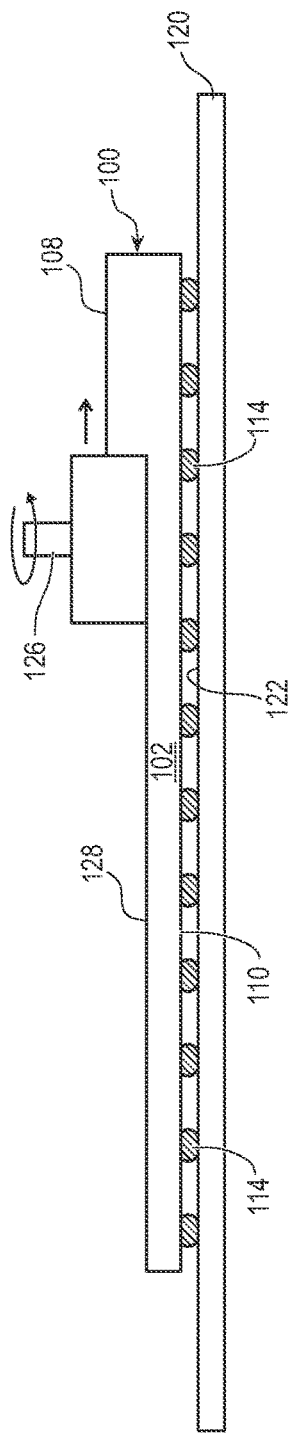
Figure 2D:
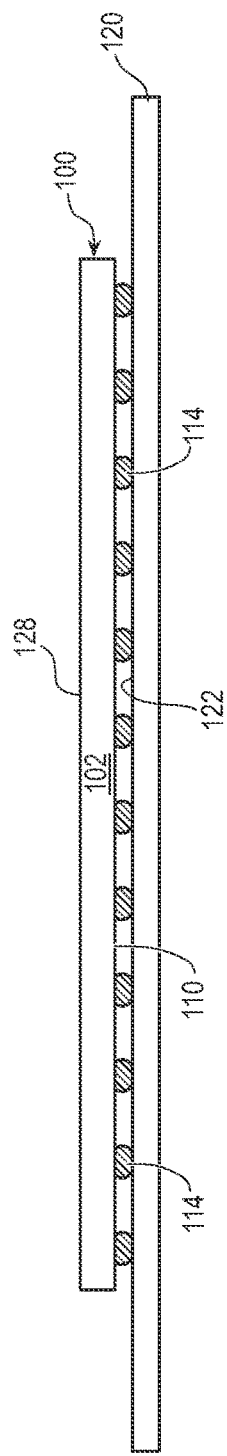
Figure 2E:
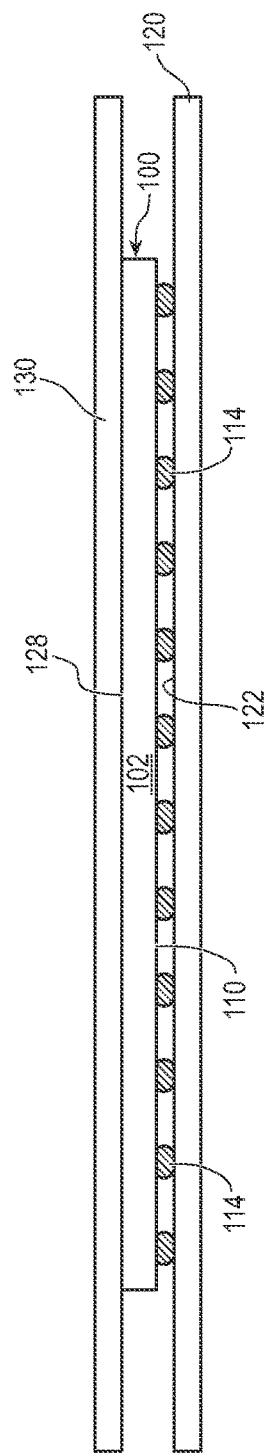
Figure 2F:
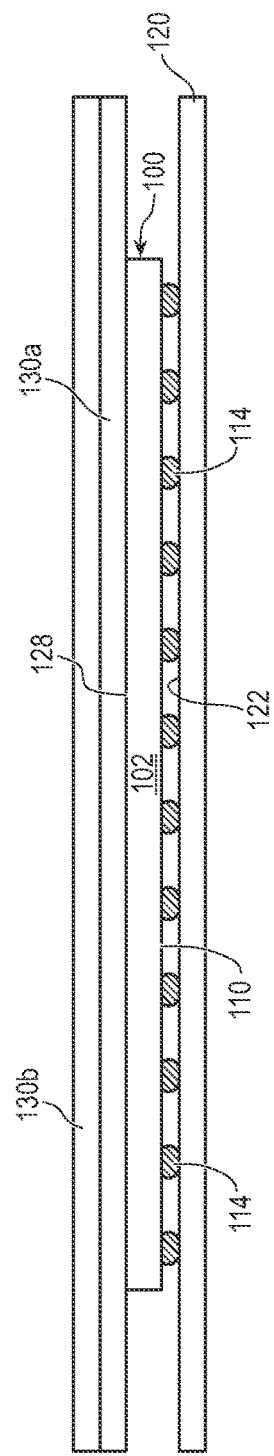
Figure 2G:
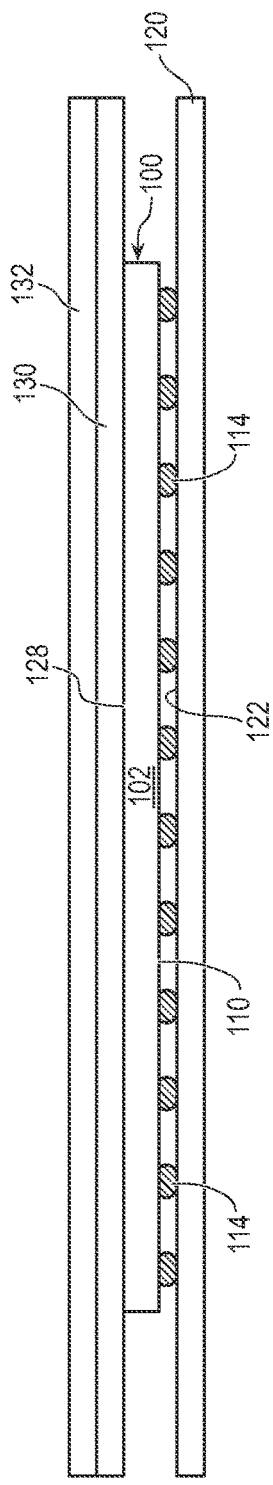
Figure 2H:
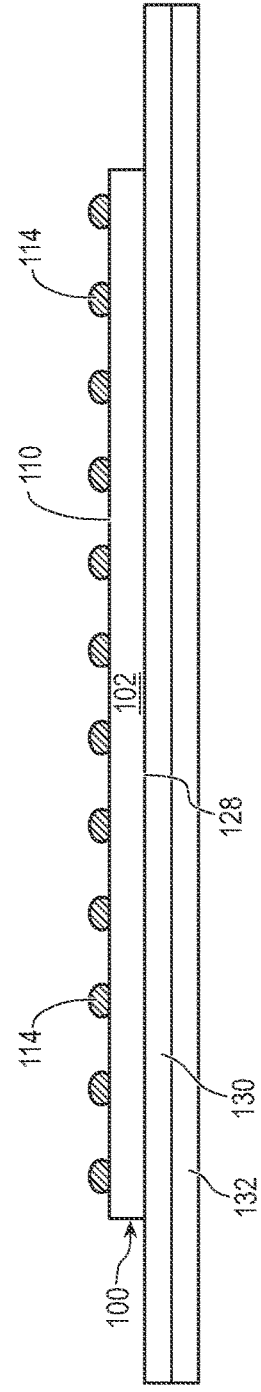
Figure 2I:
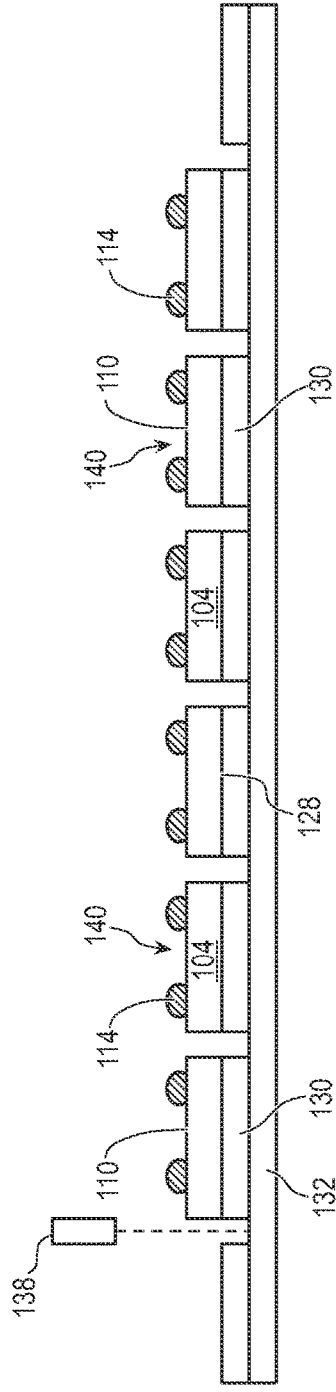
Figure 2J:
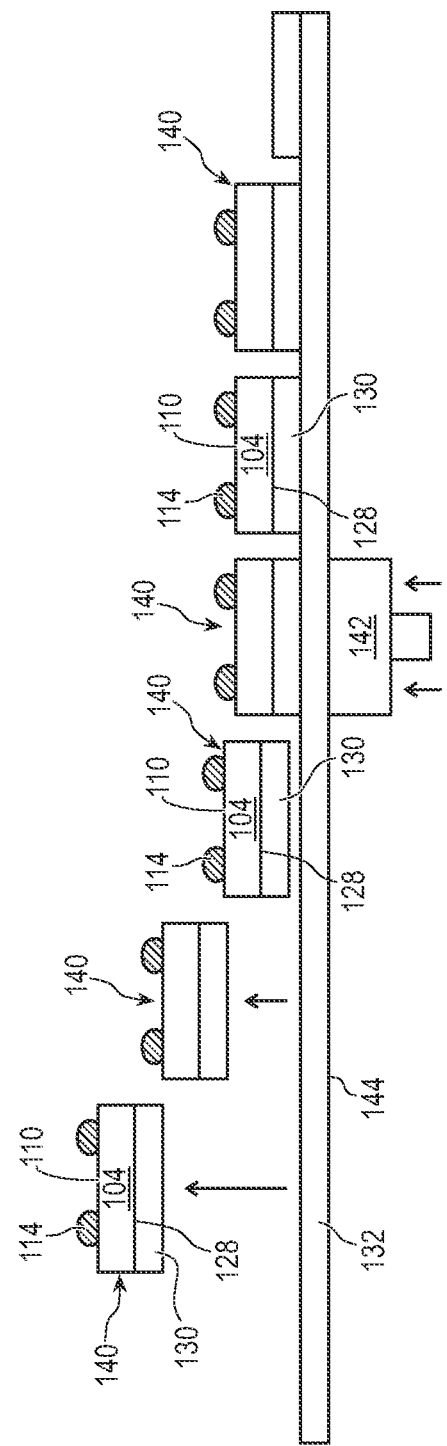
Figure 2K:
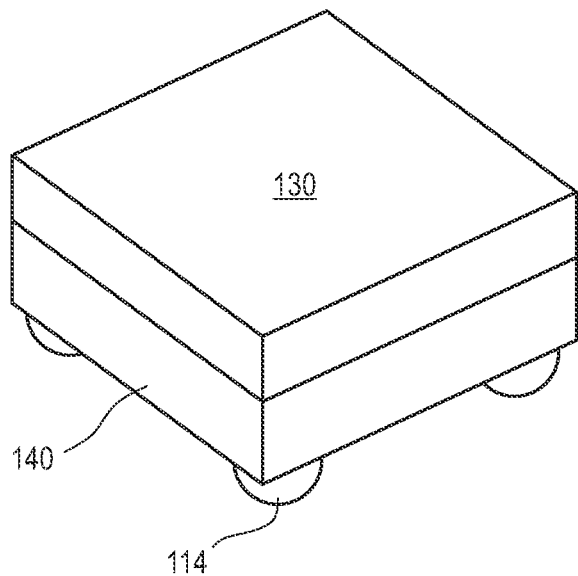
Figure 2L:
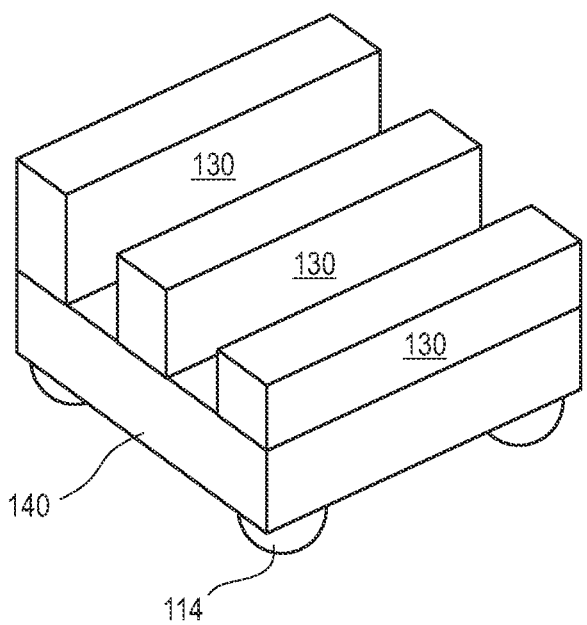
Figure 2M:
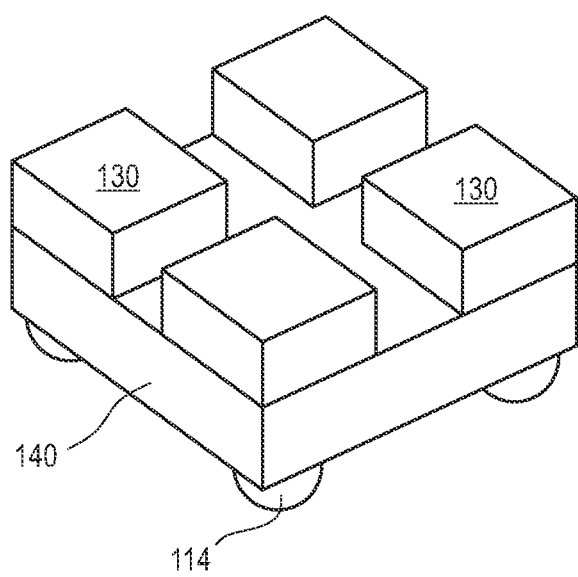
Figure 2N:
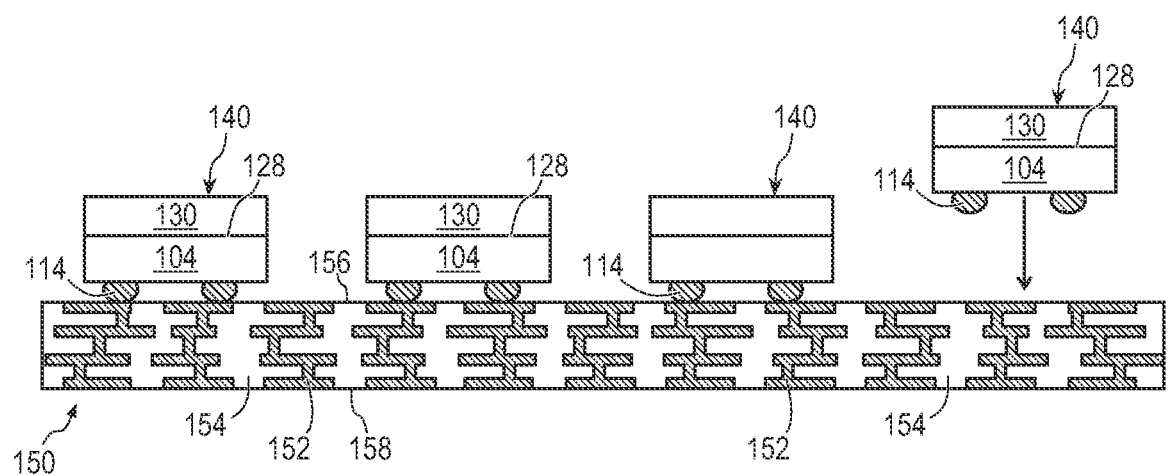
Figure 2O:
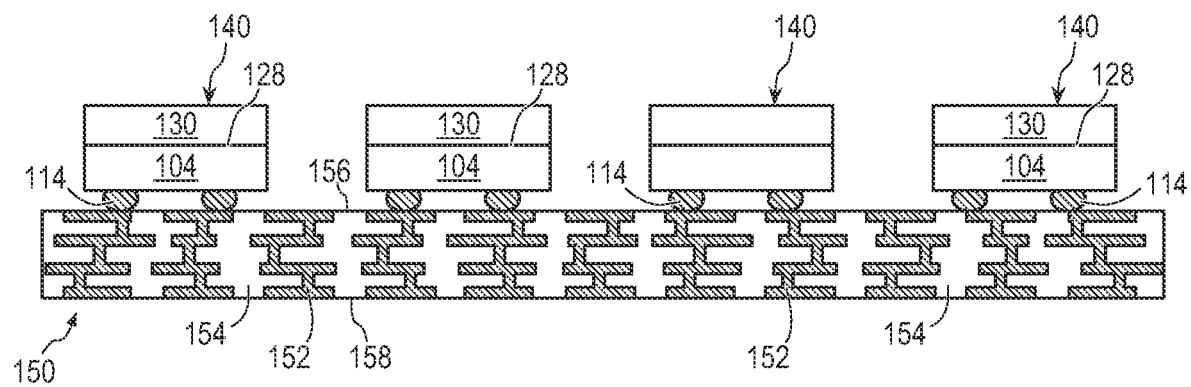
Figure 2P:
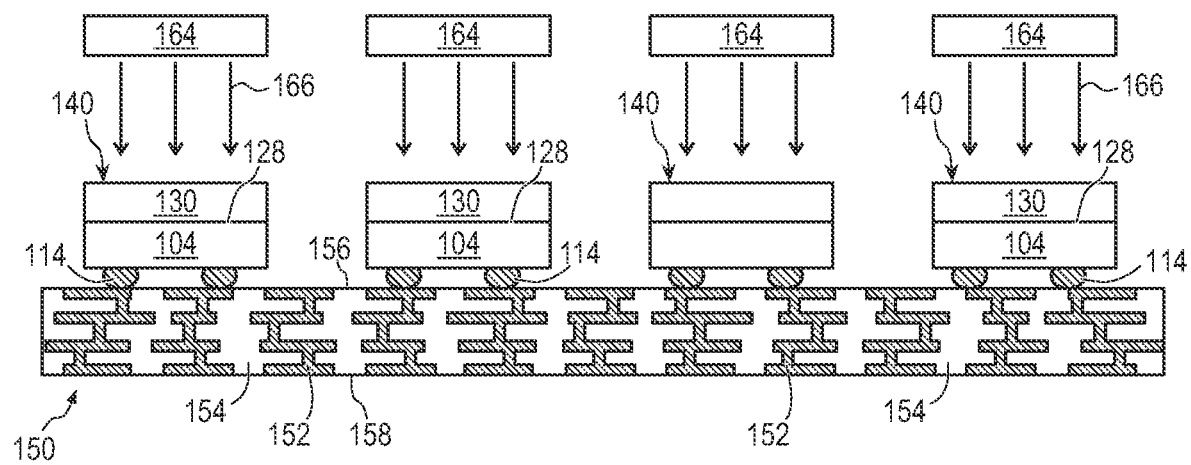
Figure 2Q:
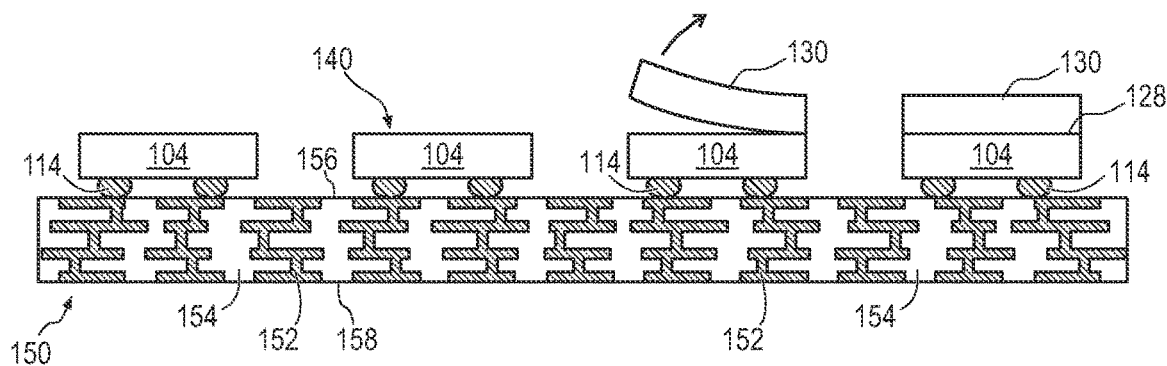
Figure 2R:
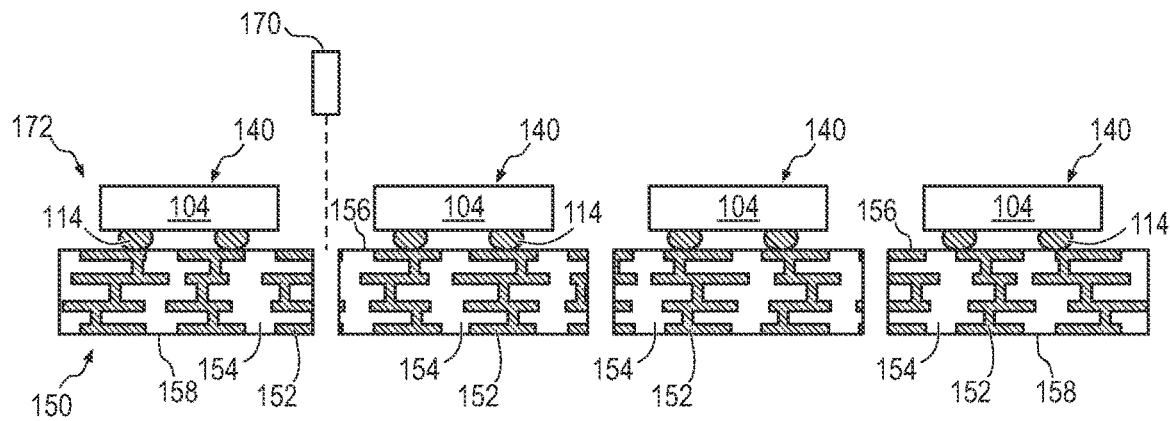

FIGS. 2a-2r illustrate a process of bonding an electrical component to a substrate using LAB. The back surface of the electrical component is covered with PI tape to reduce stress and warpage. FIG. 2a shows semiconductor wafer 100 from FIG. 1B disposed over backgrinding tape 120 with active surface 110 and bumps 114 oriented toward tacky surface 122 of the tape. Semiconductor wafer 100 is brought into contact with backgrinding tape 120 with bumps 114 adhering to tacky surface 122, as shown in FIG. 2b. Backgrinding tape 120 holds semiconductor wafer 100 securely in place during the subsequent backgrinding operation.

In FIG. 2c, back surface 108 of semiconductor wafer 100 undergoes a grinding operation with grinder 126 to reduce semiconductor wafer 100 from an original thickness of 780 μm to about 70-300 μm in thickness. The grinding operation also planarizes back surface 128 of semiconductor wafer 100. FIG. 2d shows semiconductor wafer 100 with a reduced thickness and planarized back surface 128.

In FIG. 2e, support tape 130 is adhered to back surface 128 of semiconductor wafer 100. In one embodiment, support tape 130 is polyimide (PI) tape with an adhesive coating totaling up to 250 μm in thickness. The adhesive coating can be silicone or acrylic adhesive. PI tape 130 makes direct physical contact with back surface 128 of semiconductor wafer 100 and is secured with the adhesive coating. PI tape 130 is used to provide structural support and reduce stress and warpage on the device during LAB. PI tape 130 is heat resistant to 400° C. and has a high transmittance in the near infrared (NIR) range, thus absorbing little or no laser power. PI tape 130 has a well-defined emissivity of 0.95 making it suitable for temperature monitoring with infrared (IR) camera. Other materials can be used for the support tape having similar structural and insulating properties sufficient to provide structural support and reduce stress and warpage on the device during LAB.

FIG. 2f illustrates another embodiment with multiple layers of PI tape. In this case, PI tape 130a is adhered to back surface 128 of semiconductor wafer 100. PI tape 130b is adhered to PI tape 130a to increase the overall thickness to greater than 250 μm and provide additional structural support and stress relief.

Returning to the embodiment of FIG. 2e, dicing tape 132 is applied to PI tape 130, as shown in FIG. 2g. Dicing tape 132 makes direct physical contact with PI tape 130. In FIG. 2h, the assembly is inverted and back grinding tape 120 is removed.

In FIG. 2i, semiconductor wafer 100 is singulated with saw blade or other cutting tool 138 into a plurality of semiconductor die 104. In particular, cutting tool 138 singulates semiconductor wafer 100 and PI tape 130 while leaving dicing tape 132 substantially intact. Semiconductor wafer 100 is singulated into a plurality of individual semiconductor die 104, each covered by PI tape 130 on back surface 128 and still attached to dicing tape 132. The individual semiconductor die 104 are designated as electrical components 140. In another embodiment, electrical component 140 can be a semiconductor die, semiconductor package, surface mount device, discrete electrical device, discrete transistor, diode, IPD, or other electrical device.

In FIG. 2j, ejection tool 142 pushes against surface 144 of dicing tape 132 to release electrical components 140 from the dicing tape. Electrical components 140, each with PI tape 130 disposed on back surface 128, are separated from dicing tape 132. The individual electrical component 140 can be inspected and electrically tested for identification of KGD post singulation.

FIG. 2k shows a perspective view of PI tape 130 fully covering back surface 128 of semiconductor wafer 100 with a regular rectangular shape. PI tape 130 can have other geometric shapes and patterns to optimize structural support and stress relief, such as parallel strips in FIG. 2l and islands of insulating material in FIG. 2m.

In FIG. 2n, the individual electrical components 140 from FIG. 2j are positioned over interconnect substrate 150 using a pick and place operation. Interconnect substrate or PCB 150 includes conductive layers 152 and insulating layers 154. Conductive layer 152 can be one or more layers of Al, Cu, Sn, Ni, Au, Ag, or other suitable electrically conductive material. Conductive layer 152 provides horizontal electrical interconnect across substrate 150 and vertical electrical interconnect between top surface 156 and bottom surface 158 of substrate 150. Portions of conductive layer 152 can be electrically common or electrically isolated depending on the design and function of electrical component 140. Insulating layer 154 contains one or more layers of silicon dioxide (SiO2), silicon nitride (Si3N4), silicon oxynitride (SiON), tantalum pentoxide (Ta2O5), aluminum oxide (Al2O3), solder resist, polymer, polyimide, benzocyclobutene (BCB), polybenzoxazoles (PBO), and other material having similar insulating and structural properties. Insulating layer 154 provides isolation between conductive layers 152. FIG. 2o shows electrical components 140 disposed over surface 156 of interconnect substrate 150 with bumps 114 making contact with conductive layer 152.

In FIG. 2p, electrical component 140 with PI layer 130 on back surface 128, as disposed over surface 156 of interconnect substrate 150, are subject to LAB process with lasers 164 projecting laser emission 166 to mechanically and electrically bond bumps 114 of electrical component 140 to conductive layer 152 of interconnect substrate 150. Laser emission 166 heats bumps 114 to a reflow state to mechanically and electrically bond the bumps to conductive layer 152. Alternatively, electrical component 140 can be bonded to interconnect substrate 150 with flux, non-conductive paste, non-conductive film, anisotropic conductive paste, and the like, again using LAB. In particular, PI tape 130 on back surface 128 provides heat resistant and high transmittance to absorb little or no laser power. PI tape 130 provides structural support to electrical component 140 and substantially reduces warpage during laser emission 166. LAB with PI tape 130 can be done while taking temperature measurements with IR camera, with little to no effect on manufacturing throughput. PI tape 130 disposed on back surface 128 of electrical component 140 prior to LAB substantially reduces stress and warpage on the electrical components while undergoing laser emission 166 during LAB. LAB with PI tape 130 has a greater units per hour (UPH) being processed through manufacturing than cLAB, as discussed in the background.

In FIG. 2q, PI tape 130 is removed from back surface 128 by heat, mechanical peel, chemical peel, or other tape removal procedure. In FIG. 2r, interconnect substrate 150 is singulated with saw blade or other cutting tool 170 leaving individual semiconductor packages 172 with electrical component 140 and a portion of interconnect substrate 150. Electrical component 140 does not experience warpage due to the use of PI tape 130 as structural support over the back surface of the electrical component during LAB.

Figure 3:
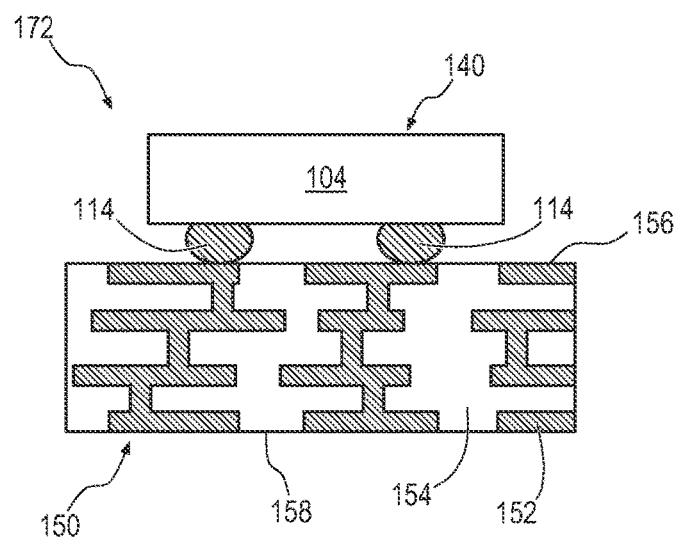
FIG. 3 illustrates the electrical component bonded to the substrate without warpage.

FIG. 3 illustrates semiconductor package 172 with electrical component 140 mounted to interconnect substrate 150 with bumps 114 bonded to conductive layer 152 using LAB. Electrical component 140 does not experience warpage due to the use of PI tape 130 during LAB. PI tape 130 disposed on back surface 128 of electrical component 140 prior to LAB substantially reduces stress and warpage on the electrical components while undergoing laser emission 166 during LAB.

Figure 4:
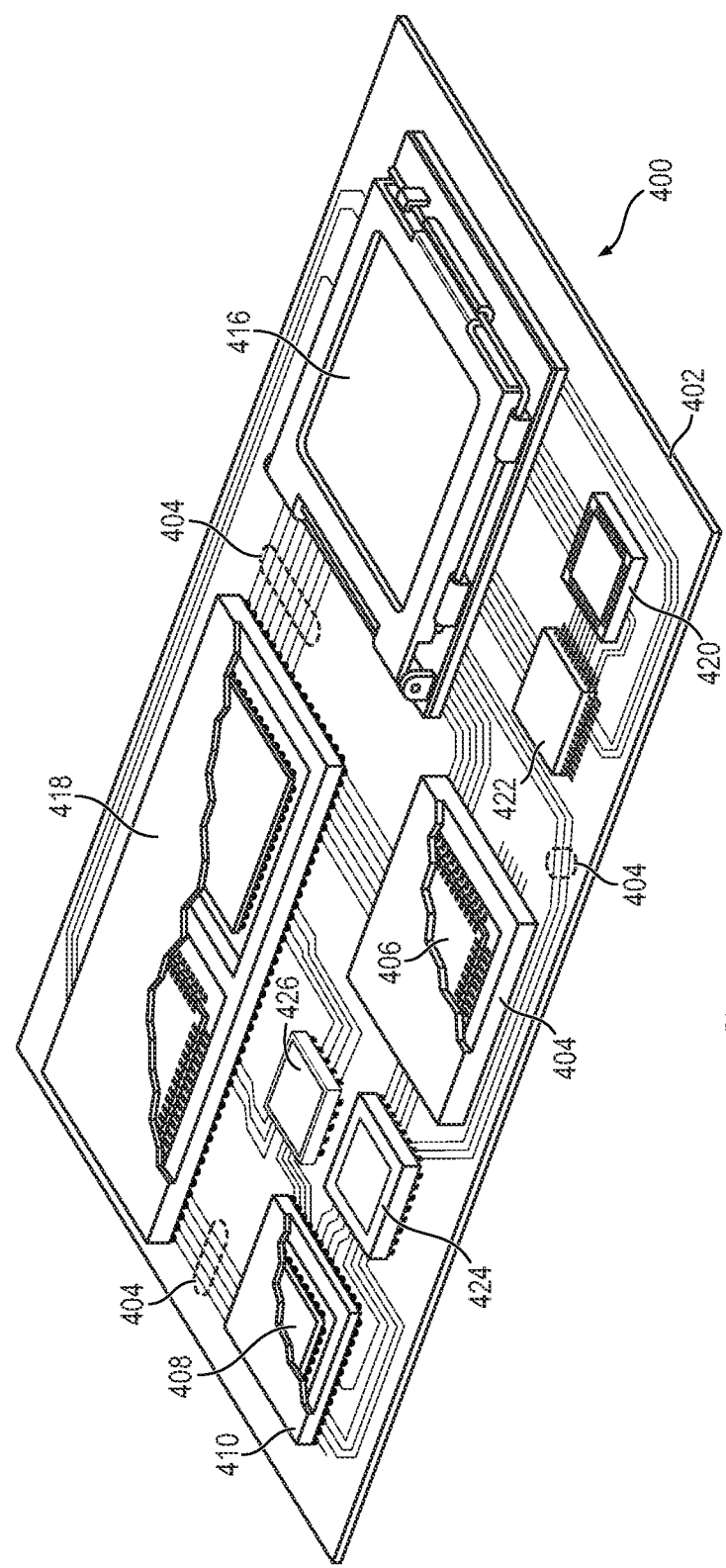
FIG. 4 illustrates a printed circuit board (PCB) with different types of packages mounted to a surface of the PCB.

FIG. 4 illustrates electronic device 400 having a chip carrier substrate or PCB 402 with a plurality of semiconductor packages mounted on a surface of PCB 402, including semiconductor package 172. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet, cellular phone, digital camera, communication system, or other electronic device. Alternatively, electronic device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 4, PCB 402 provides a general substrate for structural support and electrical interconnect of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown mounted on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   disposing a first support tape over a back surface of the semiconductor die opposite an active surface of the semiconductor die, wherein the first support tape includes a polyimide tape;
   providing a substrate;
   disposing the semiconductor die on the substrate; and
   projecting a laser emission onto the semiconductor die to bond the semiconductor die to the substrate while retaining the first support tape disposed on the semiconductor die to provide stress relief to avoid warpage of the semiconductor die during the laser emission.

2. The method of claim 1, wherein the semiconductor die is contained within a semiconductor wafer.

3. The method of claim 2, further including singulating the semiconductor wafer to provide the semiconductor die with the first support layer disposed on the back surface of the semiconductor die.

4. The method of claim 1, further including disposing a second support tape over the first support tape.

5. A method of making a semiconductor device, comprising:
   providing an electrical component;
   disposing a first support tape over a surface of the electrical component;
   projecting a laser emission onto the electrical component while retaining the first support tape disposed on the surface of the electrical component to reduce warpage of the electrical component during the laser emission; and removing a portion of the surface of the electrical component to reduce a thickness of the electrical component.

6. The method of claim 5, wherein the electrical component is contained within a semiconductor wafer.

7. The method of claim 6, further including singulating the semiconductor wafer to provide the electrical component with the first support layer disposed on the surface of the electrical component.

8. The method of claim 5, further including:
providing a substrate;
disposing the electrical component over the substrate; and
projecting the laser emission onto the electrical component to bond the electrical component to the substrate.

9. The method of claim 5, further including disposing a second support tape over the first support tape.

10. A method of making a semiconductor device, comprising:
providing an electrical component;
disposing a first support tape over a surface of the electrical component, wherein the first support tape includes a polyimide tape; and
projecting a laser emission onto the electrical component while retaining the first support tape disposed on the surface of the electrical component to reduce warpage of the electrical component during the laser emission.

11. A semiconductor device, comprising:
a semiconductor die;
a support tape disposed over a back surface of the semiconductor die opposite an active surface of the semiconductor die, wherein the support tape includes a polyimide tape; and
a laser emission projected onto the semiconductor die while retaining the support tape to provide stress relief to avoid warpage of the semiconductor die during the laser emission.

12. The semiconductor device of claim 11, wherein the semiconductor die is contained within a semiconductor wafer.

13. The semiconductor device of claim 12, wherein the semiconductor wafer is singulated to provide the semiconductor die with the support layer disposed on the back surface of the semiconductor die.

14. The semiconductor device of claim 11, further including a substrate, wherein the semiconductor die is disposed over the substrate and the laser emission is projected onto the semiconductor die to bond the semiconductor die to the substrate.

15. The semiconductor device of claim 11, further including a dicing tape disposed over the support tape.

16. A semiconductor device, comprising:
an electrical component;
a support tape disposed over a surface of the electrical component, wherein the support tape includes a polyimide tape; and
a laser emission projected onto the electrical component while retaining the support tape to reduce warpage of the electrical component during the laser emission.

17. The semiconductor device of claim 16, wherein the electrical component is contained within a semiconductor wafer.

18. The semiconductor device of claim 17, wherein the semiconductor wafer is singulated to provide the electrical component with the support layer disposed on the surface of the electrical component.

19. The semiconductor device of claim 16, further including a substrate, wherein the electrical component is disposed over the substrate and the laser emission is projected onto the electrical component to bond the electrical component to the substrate.

20. The semiconductor device of claim 16, further including a dicing tape disposed over the support tape.

* * * * *